United States Patent
Jeon

(10) Patent No.: US 10,811,932 B2
(45) Date of Patent: Oct. 20, 2020

(54) ROTARY ACTUATOR WITH ANGLED HOUSING CONNECTION

(71) Applicant: Dura Operating, LLC, Auburn Hills, MI (US)

(72) Inventor: Jinseok Jeon, LaSalle (CA)

(73) Assignee: Dura Operating, LLC, Auburn Hills, MI (US)

( * ) Notice: Subject to any disclaimer, the term of this patent is extended or adjusted under 35 U.S.C. 154(b) by 26 days.

(21) Appl. No.: 15/959,863

(22) Filed: Apr. 23, 2018

(65) Prior Publication Data

US 2019/0326792 A1 Oct. 24, 2019

(51) Int. Cl.
| | |
|---|---|
| *H02K 5/22* | (2006.01) |
| *H05K 5/03* | (2006.01) |
| *H05K 5/00* | (2006.01) |
| *H02K 11/33* | (2016.01) |
| *H05K 7/14* | (2006.01) |
| *F16H 61/00* | (2006.01) |
| *H01R 12/72* | (2011.01) |
| *F16H 61/32* | (2006.01) |

(52) U.S. Cl.
CPC ............ *H02K 5/225* (2013.01); *H02K 11/33* (2016.01); *H05K 5/0052* (2013.01); *H05K 5/0069* (2013.01); *H05K 7/1432* (2013.01); *F16H 61/0006* (2013.01); *F16H 61/32* (2013.01); *H01R 12/722* (2013.01)

(58) Field of Classification Search
CPC ............ H02K 5/04; H02K 5/10; H02K 5/225; H05K 5/0052; H05K 7/1432; H05K 5/006; F16H 61/0006; F16H 61/32; H01H 9/0044; H01H 9/0264

USPC ..................................................... 310/89, 71
See application file for complete search history.

(56) References Cited

U.S. PATENT DOCUMENTS

| | | | |
|---|---|---|---|
| 4,614,886 A | * | 9/1986 | Schneider ................. B60S 1/08 310/239 |
| 5,357,161 A | * | 10/1994 | Daniels ..................... H02K 5/04 174/50 |
| 6,118,366 A | | 9/2000 | Bulgatz et al. |
| 6,276,324 B1 | | 8/2001 | Adams et al. |
| | | (Continued) | |

FOREIGN PATENT DOCUMENTS

WO    WO 2013117619 A2  *  8/2013

OTHER PUBLICATIONS

International Search Report and Written Opinion for PCT Application No. PCT/US2019/026455 dated Jul. 1, 2019 (9 pages).

*Primary Examiner* — Burton S Mullins
(74) *Attorney, Agent, or Firm* — Vivacqua Crane, PLLC

(57) ABSTRACT

In at least some implementations, an actuator includes a motor, an output rotated by the motor about an axis, and a housing having an interior in which the motor and electrical component are received. The housing includes a first housing part and a second housing part coupled to the first housing part to define at least part of the interior. The first housing part has a first mounting surface and the second housing part having a second mounting surface arranged to overlap the first mounting surface when the second housing part and first housing part are coupled together and wherein the first mounting surface and second mounting surface are both arranged at an acute angle relative to a plane perpendicular to the axis.

9 Claims, 4 Drawing Sheets

(56) References Cited

U.S. PATENT DOCUMENTS

| | | | |
|---|---|---|---|
| 7,105,966 B2* | 9/2006 | Kopf | H02K 5/225 |
| | | | 310/89 |
| 7,196,443 B2* | 3/2007 | Kimura | H02K 3/522 |
| | | | 29/596 |
| 8,648,510 B2 | 2/2014 | Miyagawa et al. | |
| 8,816,552 B2* | 8/2014 | Bohatsch | H02K 5/04 |
| | | | 310/89 |
| 9,461,517 B2* | 10/2016 | Bratthaell | H02K 15/03 |
| 2013/0154402 A1 | 6/2013 | Basavarajappa et al. | |
| 2017/0271939 A1* | 9/2017 | Kaneko | H02K 11/33 |
| 2017/0310192 A1* | 10/2017 | Cezario | H02K 5/10 |

* cited by examiner

ROTARY ACTUATOR WITH ANGLED HOUSING CONNECTION

TECHNICAL FIELD

The present disclosure relates generally to an actuator that includes an upper housing and a lower housing with an angled housing connection, such as may be used to actuate a shifting mechanism of a vehicle transmission.

BACKGROUND

In some vehicles, a gear shift lever in a passenger compartment of the vehicle can be moved by an operator of the vehicle to shift the vehicle transmission between its park gear and other gears, such as reverse, neutral and forward drive gears. The shift lever is mechanically coupled to the transmission through a cable that transmits the shift lever movement to a transmission shift mechanism. Other vehicles use a so-called "shift-by-wire" system wherein an operator shift lever or shift control unit is not physically coupled to the transmission shift mechanism by a cable. Instead, the shift control unit is electrically coupled to a shift actuator that is arranged to shift the transmission upon receipt of a signal from the shift control unit that a transmission gear shift is desired by the operator.

Further, the space in which the shift control unit is located is often adjacent to the transmission and in a confined space such that larger units cannot be located where desired and links, cables or other connecting members are needed between the shift control unit and the transmission shift lever.

SUMMARY

In at least some implementations, an actuator includes a motor, an output rotated by the motor about an axis, and a housing having an interior in which the motor and electrical component are received. The housing includes a first housing part and a second housing part coupled to the first housing part to define at least part of the interior. The first housing part has a first mounting surface and the second housing part having a second mounting surface arranged to overlap the first mounting surface when the second housing part and first housing part are coupled together and wherein the first mounting surface and second mounting surface are both arranged at an acute angle relative to a plane perpendicular to the axis.

In at least some implementations, the first housing part includes a tubular sidewall having a portion that extends parallel to the axis or within ten degrees of parallel to the axis and wherein the first mounting surface is defined at an end of the sidewall that circumscribes an open end of the first housing part. The actuator may also include a component that extends outwardly beyond the sidewall of the first housing part and wherein the first mounting surface is axially spaced from the component. The component may be received within an opening formed in the second housing part.

In at least some implementations, the axial position of the first mounting surface relative to a plane that extends through the sidewall and is perpendicular to the axis may vary in a circumferential direction around the first mounting surface. And the area of the first mounting surface that is closest to the plane may be rotationally aligned with the component.

The motor may be part of an assembly that includes a circuit board coupled to the motor, and wherein at least a portion of the first housing part overlaps the full axial extent of the motor and circuit board or is within a few millimeters (e.g. 4 or less) of overlapping the full axial extent of the motor and circuit board.

In at least some implementations, the first mounting surface is planar. In at least some implementations, the first mounting surface is planar and the second mounting surface is planar. In at least some implementations, the first mounting surface is elliptical.

In at least some implementations, an actuator includes a motor assembly including a motor, a circuit board electrically coupled to the motor and including an electrical connector extending outwardly beyond the motor, and an output rotated by the motor about an axis, a first housing part and a second housing part. The first housing part has a base, a sidewall extending from the base and a first mounting surface at a free end of the sidewall. The second housing part is coupled to the first housing part to define an interior in which the motor assembly is received. The second housing part has a second mounting surface overlapped with the first mounting surface and an opening spaced from the mounting surface in which the electrical connector is at least partially received. The first mounting surface and second mounting surface are both arranged at an acute angle relative to a plane perpendicular to the axis.

In at least some implementations, the plane extends through the sidewall spaced from the first mounting surface and the axial position of the first mounting surface relative to the plane varies in a circumferential direction around the first mounting surface, and the area of the first mounting surface that is closest to the plane is rotationally aligned with the electrical connector.

In at least some implementations, the first mounting surface and/or the second mounting surface is planar. The first mounting surface and/or the second mounting surface may be elliptical.

BRIEF DESCRIPTION OF THE DRAWINGS

The following detailed description of some implementations of a shifter will be set forth with regard to the accompanying drawings, in which.

DETAILED DESCRIPTION

Figure 1:
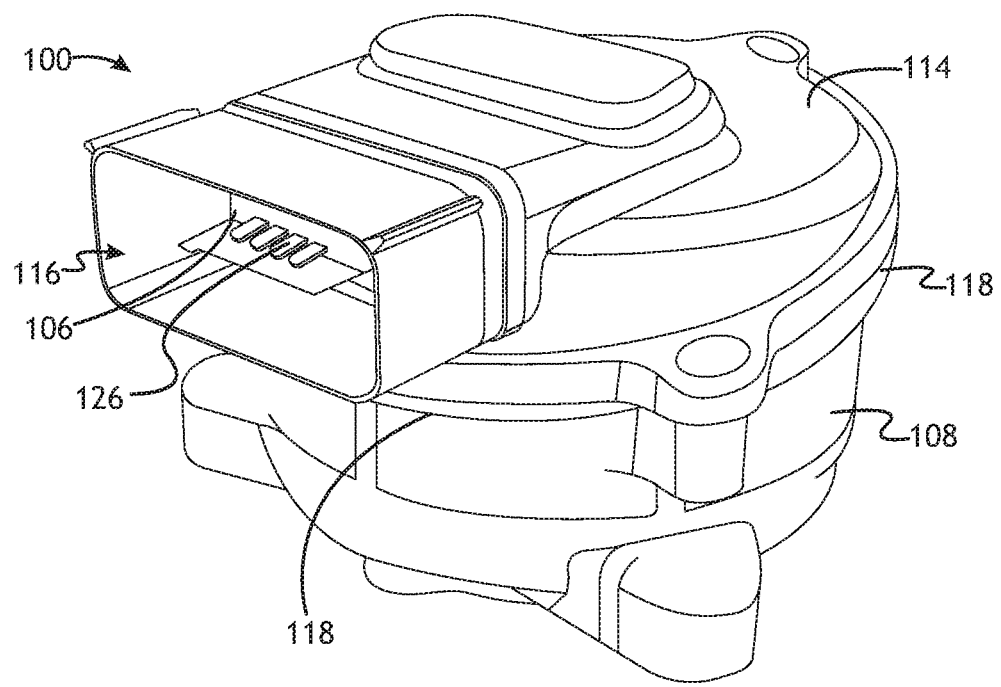
FIG. 1 is an isometric view of an exemplary rotary actuator.
Figure 2:
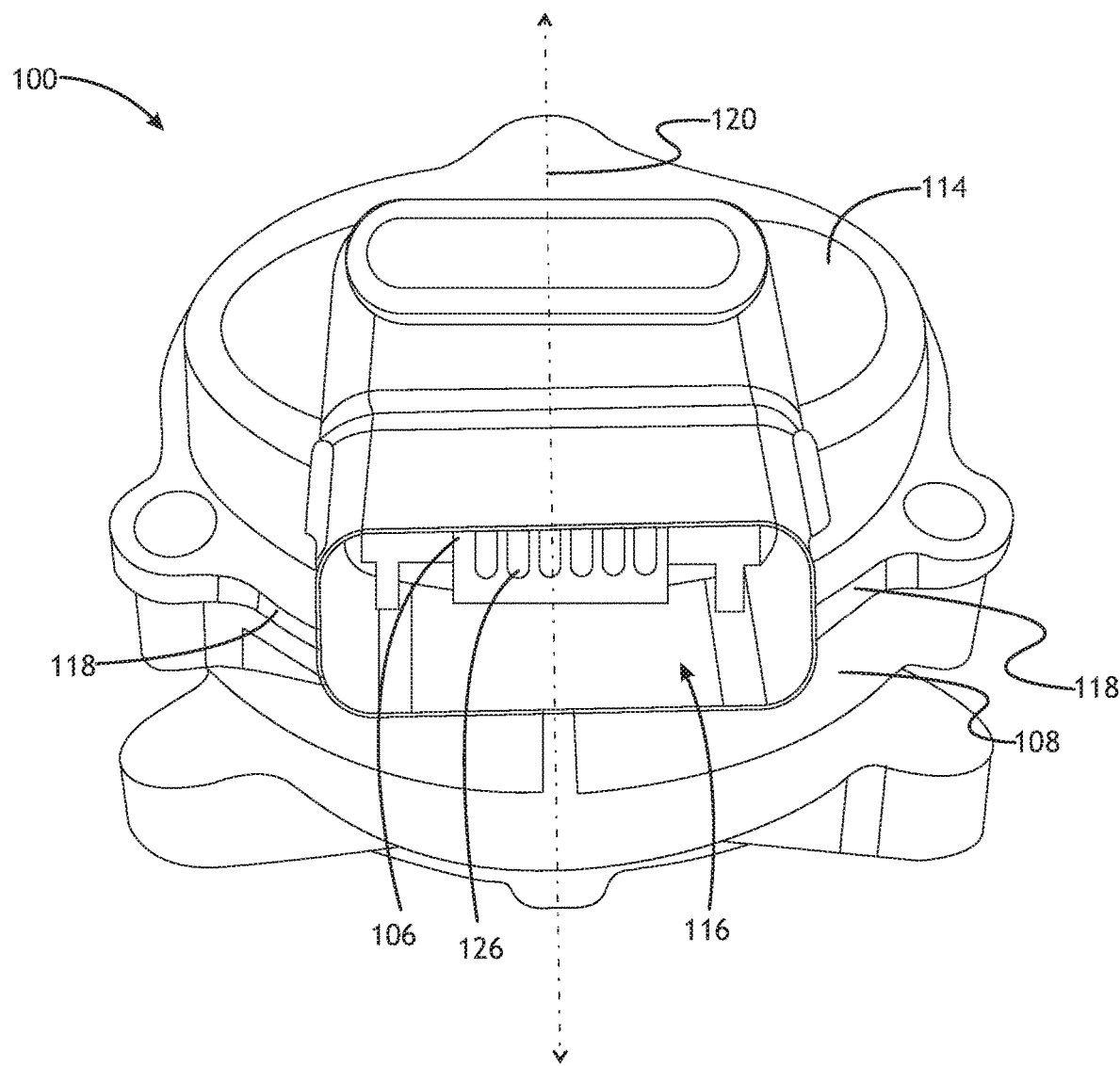
FIG. 2 is an isometric view of the rotary actuator.

Referring in more detail to the drawings, FIGS. 1-6 illustrate a rotary actuator 100 having a motor assembly 102 that can drive an output 103 for rotation about an axis 105. Among other things, the output 103 may be coupled to a shifting mechanism of a vehicle transmission, or to a different component as desired. In at least some implementations, the rotary actuator 100 can include a motor assembly 102 that may include a motor 107 and a printed circuit board 104 coupled to the motor. The motor assembly 102 can be received in a housing 109 that includes a first or lower housing part 108 and a second or upper housing part 114 (hereafter called upper and lower housings 108, 114) that are coupled together, where a housing connection 118 (or housing mating) between the lower housing 108 and the upper housing 114 is not parallel to a reference plane 112 that is perpendicular to the axis 105 of rotation of the output 103.

In at least some embodiments, the motor assembly 102 may include a motor and/or other components that can be associated with the motor in addition to the circuit board 104 that are known to one of skill in the art. In some implementations, the motor in the motor assembly 102 can include a brushless motor that is a multi-phase, electrically commutated motor. Some examples of a motor utilized in the motor assembly 102 may include a permanent magnet synchronous motor, an asynchronous/induction motor, and/or a switched reluctance motor.

In the embodiments illustrated in FIGS. 1-6, the rotary actuator 100 can include a printed circuit board 104 that is electrically and/or mechanically coupled to the motor 107. For example, the printed circuit board 104 can be coupled to posts extending from a housing or casing of the motor or the lower housing 108. In at least some implementations, the printed circuit board 104 can include all the components needed for operation of the rotary actuator 100. Non-limiting examples of components that may be included on the printed circuit board 104 can include power control circuitry for the motor 107, a controller for the motor, and/or a position sensor capable to provide feedback regarding the rotational position of the motor 107 or output 103.

The rotary actuator 100 can include an electrical connector 106 having connector pins 126, which may be disposed on and connected to the circuit board 104. The connector 106 can be configured to provide external access to the printed circuit board 104 and/or the motor assembly 102. In some implementations, the connector 106 can include a male-type connector. In some implementations, it is contemplated that the connector 106 can include a female-type connector. Additionally, the connector 106 can be configured to extend at least partially into and/or protrude through a connector opening 116 in the upper housing 114.

As illustrated in FIGS. 1-6, the motor assembly 102 can be coupled to or otherwise located within the lower housing 108, and the lower housing 108 can be configured to at least partially house and protect the motor assembly 102 from environmental conditions. In at least some implementations, the lower housing 108 is generally cup-shaped or concave and has a base 110 at a first or lower end and a tubular sidewall 111 extending from the base 110 to an open upper end that defines a first mounting surface 122. The base 110 of the lower housing 108 can include an axially outer or lowermost surface of the lower housing, and in at least some implementations can be disposed on a plane parallel to the reference plane 112, as shown in FIGS. 3-6. In some embodiments, the lower housing 108 can include an opening in the base 110 portion through which an output 103 may extend or be accessed. The mounting surface 122 may be defined around the perimeter of the upper end of the lower housing 108 and may be generally planar to, for example, provide a surface against which a seal can be trapped between the lower housing 108 and upper housing 114. Additionally, the lower housing 108 may include one or more holes through which a fastener may be received to couple the lower housing 108 to the upper housing 114 and/or an external component (e.g., a vehicle transmission). The lower housing 108 may be formed of any desired polymeric, composite, or metal material that is sufficiently strong to maintain axial rotation of the output and may be formed of sufficiently durable and resistant to the operating conditions in which the lower housing 108 is used.

The upper housing 114 can be configured to be coupled to the lower housing 108 at the housing connection 118 to collectively define with the lower housing an interior of the actuator housing 109. The upper housing 114 can be configured to cover and house an upper portion of the motor assembly 102. In at least some implementations, the upper housing 114 may be generally cup-shaped and have an upper wall 113 and may have a generally cylindrical and tubular sidewall 115 extending from the upper wall 113, around part or all of the periphery of the upper housing and to an upper housing mounting surface, also called herein a second mounting surface 124, at an open end of the upper housing opposite the upper wall. The upper housing 114 may be formed of any desired polymeric, composite or metal material that is sufficiently durable and resistant to the operating conditions in which the upper housing 114 is used. With an automotive transmission, the actuator housing 109 may be subjected to temperatures of 150 degrees Celsius or more. If desired, the lower and upper housings 108, 114 may include ribs, fins or other heat dissipating features.

As noted above, the upper housing 114 may include a connector opening 116 through which an electrical connection can be made to the printed circuit board 104 received within the upper housing 114. The connector opening 116 may be configured to at least partially receive the connector 106, which may include the connector pins 126, and/or an external connector, such as a female-type connector. In the implementation shown, the connector opening is defined in a cover 127 that extends outwardly from the upper housing 114 generally perpendicular to the axis 105 and generally parallel to the reference plane 112. The cover 127 is defined by a tubular wall having an inner surface that surrounds and defines the opening 116 which may have any desired shape. In the example shown, the opening 116 is a rounded rectangle in cross-section. The cover 127 or opening 116 can be configured to receive an external connector, such as an external female-type connector, where the connector opening 116 can include sufficient clearance between the portion of the connector opening 116 configured to couple to the external connector and the body of the upper housing 114 and/or the lower housing 108 such that the external connector can fully couple with the cover 127 and connector 106. The cover 127 may include one or more retention features arranged on the inner surface or an opposite outer surface and adapted to engage a mating retention feature on an electrical connector that is coupled to the connector and/or the housing to prevent inadvertent removal of the mated connector from the cover 127 and connector 106. In the example shown, the cover is constructed so that a portion of a mating electrical connector is received over the wall, surrounding at least a portion of the cover. Of course, other arrangements of electrical connectors may be used.

As illustrated in FIGS. 3-6, the upper housing 114 can be coupled to the lower housing 108 at the housing connection 118. The housing connection 118 may be defined by the first mounting surface 122 and second mounting surface 124 which are overlapped and may be engaged with each other and/or with a gasket or seal between them. In the embodiments shown in FIGS. 3-6, the housing connection 118 can be planar and arranged in or parallel to a second plane 120. That is, first mounting surface 122 and the second mounting surface 124 can each be planar and parallel to each other when the upper and lower housings are coupled together. In at least some implementations, the first mounting surface and second mounting surface are not parallel to the reference plane 112, and are instead inclined at an acute included angle relative to the reference plane 112. Thus, the first mounting surface and second mounting surface are also not perpendicular to the axis 105 of the output. In implementations wherein the lower housing sidewall 111 is cylindrical and extends axially (i.e. parallel to the axis 105), the first mounting surface 122 defines an ellipse. The second mounting surface 124 may likewise define an ellipse, if desired.

Figure 3:
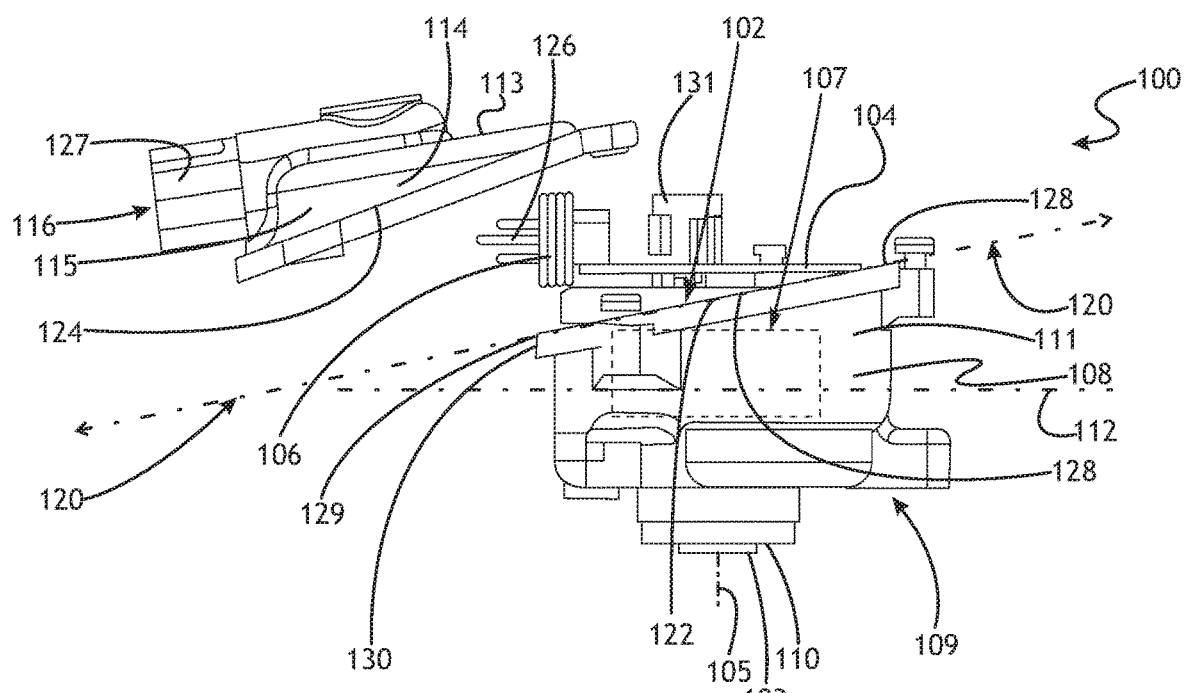
FIG. 3 is a partially exploded side view of the rotary actuator showing how the upper housing can be placed over the lower housing.
Figure 4:
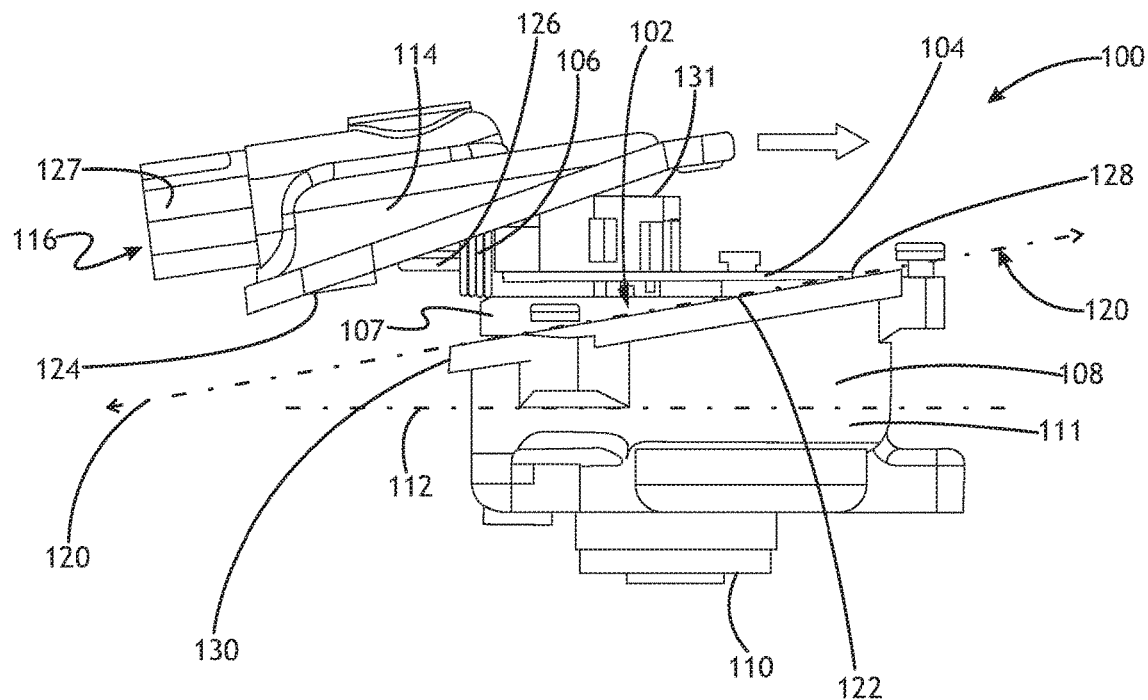
FIG. 4 is a partially exploded side view of the rotary actuator showing how the upper housing can be placed over the lower housing.
Figure 5:
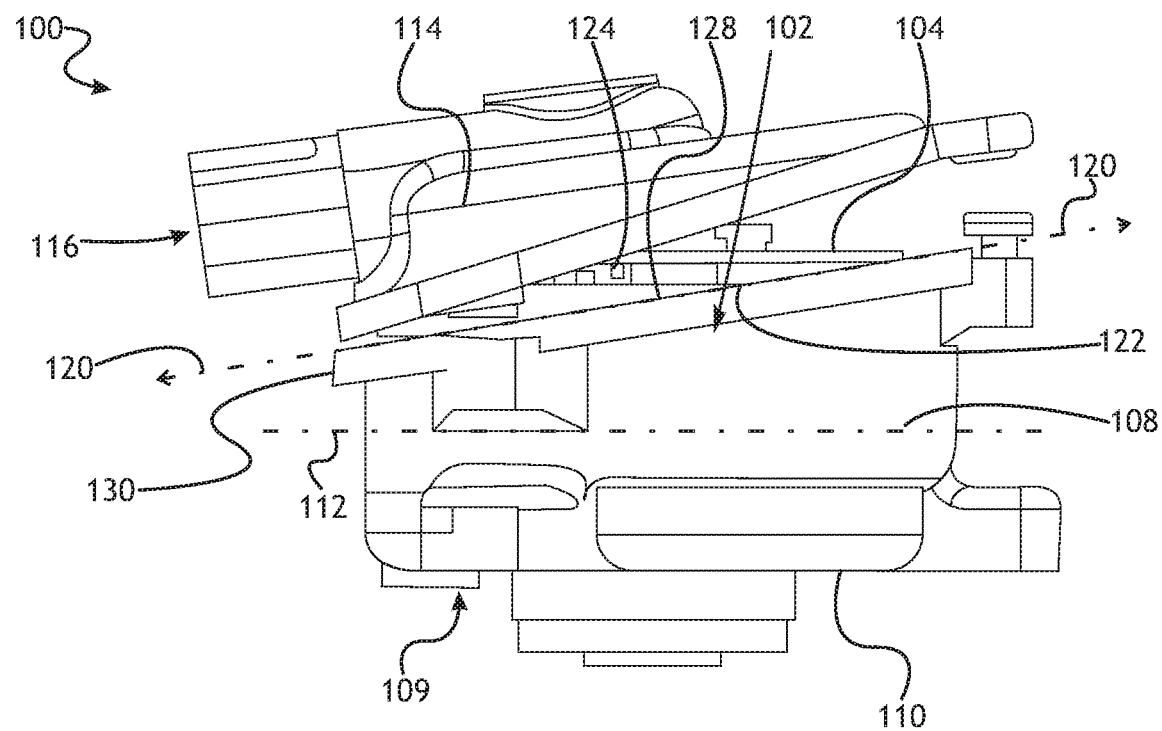
FIG. 5 is a partially exploded side view of the rotary actuator showing how the upper housing can be placed over the lower housing.

In at least some implementations, when the reference plane 112 intersects the sidewall of the lower housing spaced from the mounting surface, the distance of the first mounting surface from the reference plane 112 varies along the first mounting surface (e.g. along the perimeter of the surface or in the circumferential direction along the surface). In other words, the axial distance between the second plane 120 and the reference plane 112 varies along the mounting surface 122 or the housing connection 118. As shown in FIGS. 3-5, in at least some implementations, the lower housing sidewall 111 has a portion with an axial length sufficient to axially overlap the entire motor 107, and the sidewall may also have a portion that axially overlaps the circuit board 104 or is within a few millimeters (e.g. 4 or less) of the circuit board if no component on the circuit board conflicts with the upper housing during assembly. Relative to the reference plane 112, the first mounting surface 122 may have a first portion 128 at a greatest distance from the plane 112 and diametrically opposed to the first portion 128, the mounting surface may have a second portion 129 that is closest to the plane 112. At the second portion 129, the sidewall 111 might not axially overlap all of the motor 102, and in at least some implementations, does not overlap any of the connector 106. The second portion 129 of the sidewall 111 may be circumferentially or rotationally aligned with the connector 106, or within 30 degrees of the connector, in the assembled position of the actuator 100. In the example shown, the second portion 129 which has the shortest sidewall 111 (referring to the axial length between the base 110 and first mounting surface 122), is aligned with the connector 106 which provides the most clearance between the connector 106 and the first mounting surface 122 of the lower housing 108. This clearance facilitates receipt of the connector 106 within the connector opening 116, which is fully enclosed by the material of the upper housing 114.

To accommodate the connector 106 within the opening 116 defined in the upper housing 114, the upper housing sidewall 115 may have its greatest axial length (e.g. relative to the reference plane, or from the upper wall 113 to the second mounting surface 124) in the area of the connector 106 and thus, aligned with the portion of the lower housing sidewall 111 having the shortest length. Also, the diametrically opposed portion of the upper housing 114 may have the shortest axial length (indeed, it may be nothing more than the thickness of the second mounting surface 124) and may align with the first portion 128 of the lower housing sidewall 111 having the greatest axial length. In this way, the upper wall 113 of the upper housing 114 and the base 110 of the lower housing 108 may be arranged generally parallel to the reference plane 112 (e.g. parallel or within 10 degrees of parallel) while the mounting surfaces 122, 124 are arranged at an angle of between 5 and 20 degrees relative to the reference plane 112.

In at least some implementations, at least a majority of the mounting surfaces 122, 124 are arranged at an acute angle relative to the reference plane 112 and in some implementations, as noted above, the mounting surfaces 122, 124 are planar and the entire mounting surfaces are at the same angle. However, the mounting surfaces 122, 124 need not be planar or inclined at the same angle relative to the reference plane along their entire extents. In some implementations, the mounting surfaces 122, 124 may have two planar portions arranged at different angles (one portion may be parallel to the reference plane 112) and the portions may be joined by a bend or transition. Or the mounting surfaces may be formed without any significant planar extent in which case the angle of the mounting surface, and thus the housing connection, can be measured by the angle between the reference plane 112 and a line that intersects the point of a mounting surface 122 or 124 farthest from the plane 112 and the point of the same mounting surface 122 or 124 closest to the plane 112. An advantage of using planar mounting surfaces 122, 124 is that a planar seal or gasket may be used to seal the housing connection while more complex or contoured mounting surfaces may require a seal having matching contours.

Figure 6:
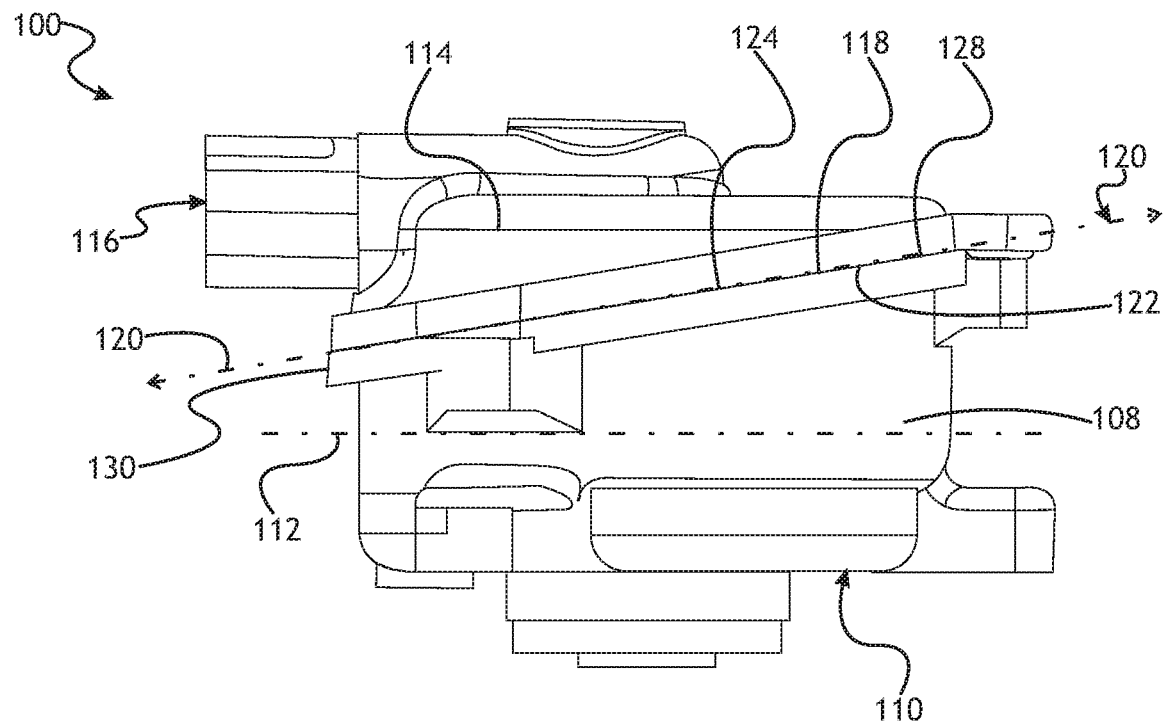
FIG. 6 is a side elevation view of the rotary actuator showing the upper housing coupled to the lower housing.

FIGS. 3 through 6 illustrate an assembly process for the actuator 100. In FIG. 3, the upper housing 114 has been positioned to a side of the lower housing 108 with the connector opening 116 aligned with the connector 106. In FIG. 4, the upper housing 114 has been partially overlapped with the lower housing 108 and the connector 106 and connector pins 126 are initially received in the connector opening 116. In FIG. 5, the upper housing 114 has been further overlapped with the lower housing and the connector is fully received in the connector opening (at least to the extent the connector will be received in the opening when fully assembled). Thus far in the assembly process, the upper housing 114 may be inclined relative to the lower housing to facilitate fitting the connector 106 within the connector opening 116 and to provide some clearance between the upper housing 114 and the rest of the motor assembly 102, for example electrical circuit elements 131 on the circuit board which may extend from the circuit board toward the upper wall of the upper housing. In FIG. 6, the upper housing 114 is coupled and fastened to the lower housing 108 and the motor assembly 102 is contained within the housing 109.

This angled housing connection 118 can enable the upper housing 114 to be attached and coupled to the lower housing 108 from a side of the rotary actuator 100 (e.g., side proximate to the connector 106 and/or connector opening 116) and over the printed circuit board 104 and the connector 106, which connector 106 may extend past an outer edge or outer surface 130 of the lower housing sidewall 111. That is, the upper housing 114 may be slid onto the lower housing 108 in a direction perpendicular to or within 20 degrees of perpendicular to the axis of rotation 105 of the actuator. Previous actuators had housing connections that were perpendicular to the axis of the actuator so the direction of assembly was more parallel to the axis and thus, perpendicular to the direction in which the connector extended outwardly from the housing. Because of this, the pins had to be press-fit to the circuit board through an opening in the housing after the housing was assembled, and then the opening had to be partially filled with a potting or overmold material. Tolerances for a good press-fit are difficult to achieve and potting or other sealing methods are subject to leakage or costly to provide.

While described with reference to an electrical connector extending outwardly from a circuit board, an actuator may have a different component (electrical or not) that extends outwardly in a similar fashion. Accordingly, this disclosure is not limited to actuators with electrical connectors extending outwardly from a housing or housing part. The angled housing connection and angled mounting surfaces of the housing can be used in other implementations.

While the forms of the invention herein disclosed constitute presently preferred embodiments, many others are possible. It is not intended herein to mention all the possible equivalent forms or ramifications of the invention. It is understood that the terms used herein are merely descriptive, rather than limiting, and that various changes may be made without departing from the spirit or scope of the invention.

The invention claimed is:

1. An actuator, comprising:
a motor;
an output rotated by the motor about an axis;
a housing having an interior in which the motor and electrical component are received, the housing including a first housing part and a second housing part coupled to the first housing part to define at least part of the interior, the first housing part having a first mounting surface and the second housing part having a second mounting surface arranged to overlap the first mounting surface when the second housing part and first housing part are coupled together and wherein the first mounting surface and the second mounting surface are both arranged at an acute angle relative to a plane perpendicular to the axis, wherein the first housing part includes a tubular sidewall having a portion that extends parallel to the axis or within ten degrees of parallel to the axis and wherein the first mounting surface is defined at an end of the sidewall that circumscribes an open end of the first housing part; and
a component that extends outwardly beyond the sidewall of the first housing part and wherein the first mounting surface is axially spaced from the component, wherein the component is received within an opening formed in the second housing part.

2. The actuator of claim 1 wherein the motor is part of an assembly that includes a circuit board 104 coupled to the motor 107, and wherein at least a portion of the first housing part 111 overlaps the full axial extent of the motor and circuit board.

3. The actuator of claim 1 wherein the first mounting surface is planar.

4. The actuator of claim 1 wherein the first mounting surface is planar and the second mounting surface is planar.

5. The actuator of claim 1 wherein the component is an electrical connector and the opening in the second housing part is circumscribed by material of the second housing part.

6. An actuator, comprising:
a motor assembly including a motor, a circuit board electrically coupled to the motor and including an electrical connector extending outwardly beyond the motor, and an output rotated by the motor about an axis;
a first housing part having a base, a sidewall extending from the base and a first mounting surface at a free end of the sidewall; and
a second housing part coupled to the first housing part to define an interior in which the motor assembly is received, the second housing part having a second mounting surface overlapped with the first mounting surface and an opening spaced from the mounting surface in which the electrical connector is at least partially received, and wherein the first mounting surface and second mounting surface are both arranged at an acute angle relative to a plane perpendicular to the axis.

7. The actuator of claim 6 wherein the first mounting surface is planar.

8. The actuator of claim 6 wherein the first mounting surface is planar and the second mounting surface is planar.

9. The actuator of claim 6 wherein the opening in the second housing part is circumscribed by material of the second housing part.

* * * * *